(12) United States Patent
Ryu et al.

(10) Patent No.: US 6,822,526 B2
(45) Date of Patent: Nov. 23, 2004

(54) VOLTAGE PLANE WITH HIGH IMPEDANCE LINK

(75) Inventors: Woong H. Ryu, Folsom, CA (US); Hany M. Fahmy, Mather, CA (US)

(73) Assignee: Intel Corporation, Santa Clara, CA (US)

(*) Notice: Subject to any disclaimer, the term of this patent is extended or adjusted under 35 U.S.C. 154(b) by 144 days.

(21) Appl. No.: 10/334,961

(22) Filed: Dec. 30, 2002

(65) Prior Publication Data

US 2004/0124940 A1 Jul. 1, 2004

(51) Int. Cl.$^7$ ................................................ H01P 5/00

(52) U.S. Cl. ...................... 333/12; 333/22 R; 333/24 C

(58) Field of Search .............................. 333/12, 32, 33, 333/181, 185, 210, 22 R, 24 R, 24 C

(56) References Cited

U.S. PATENT DOCUMENTS

| | | | | |
|---|---|---|---|---|
| 5,105,172 A | * | 4/1992 | Khatibzadeh et al. | 333/175 |
| 5,165,055 A | * | 11/1992 | Metsler | 333/12 |
| 5,903,050 A | * | 5/1999 | Thurairajaratnam et al. | 257/695 |
| 6,762,368 B2 | * | 7/2004 | Saputro et al. | 174/260 |

* cited by examiner

*Primary Examiner*—Robert Pascal
*Assistant Examiner*—Dean Takaoka
(74) *Attorney, Agent, or Firm*—Buckley, Maschoff & Talwalkar LLC

(57) ABSTRACT

According to some embodiments, a voltage plane with a high impedance link is provided. For example, the high impedance link might be a meandered conducting neck between a first low impedance voltage plane portion and a second low impedance voltage plane portion. As other examples, the high impedance link might be a stepped impedance filter or a slotted around filter.

37 Claims, 12 Drawing Sheets

VOLTAGE PLANE WITH HIGH IMPEDANCE LINK

BACKGROUND

A surface at a particular voltage level, referred to as a "power plane," can distribute power in a Printed Circuit Board (PCB) or an Integrated Circuit (IC). Similarly, a ground plane can distribute ground in a PCB or an IC. As system bandwidth increases (e.g., in a system associated with high frequency signals), effective power and ground distribution becomes more important. In particular, reducing noise inference between power planes and/or ground planes may enable operation at a higher system bandwidths.

One example of a power plane is a power bus ($V_{TT}$) that distributes power to components. In this case, a termination resistor ($R_{TT}$) can be provided to reduce noise interference (e.g., signal reflection) in order to improve voltage fluxuation, flight time variation, and noise margins. Moreover, it is known that interference between power planes can be reduced using decoupling capacitors.

For example, FIG. 1 illustrates the performance of a typical decoupling capacitor (e.g., having an equivalent circuit model 110). Note that once the frequency of a signal rises past a certain level (e.g., a frequency level associated with series resonance), the decoupling capacitors become less effective (i.e., the amount of noise interference 120 increases). As a result, the system bandwidth may be limited. In the case of ground planes, similar problems may cause Electro-Static Discharge (ESD) and ground bounce noise interference problems.

DETAILED DESCRIPTION

Some embodiments described herein are directed to a "voltage plane." As used herein, the phrase "voltage plane" may refer to a ground plane, a power plane, and/or a power bus. Moreover, a voltage plane may be associated with an IC, an Application Specific Integrated Circuit (ASIC), a processor such as a Central Processing Unit (CPU), a memory device, a package, a chipset, a PCB, and/or a motherboard.

High Impedance Link

Figure 1:
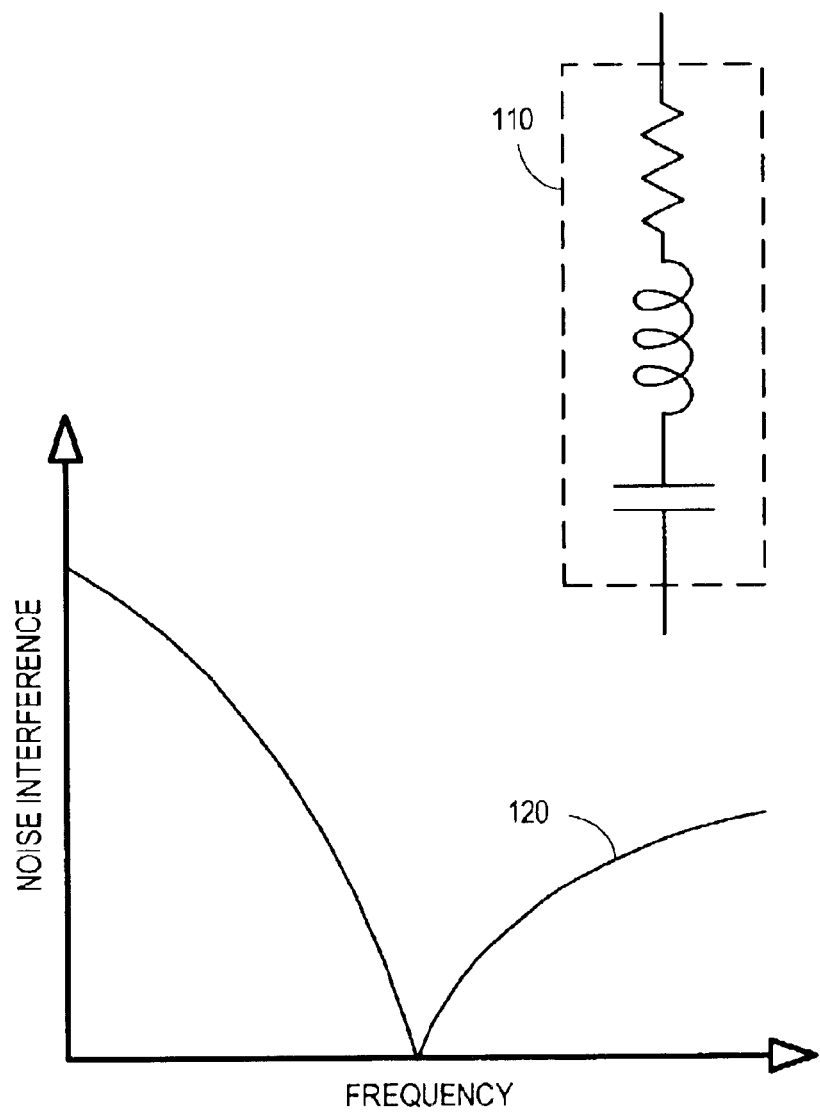
FIG. 1 illustrates the performance of a typical decoupling capacitor.
Figure 2:
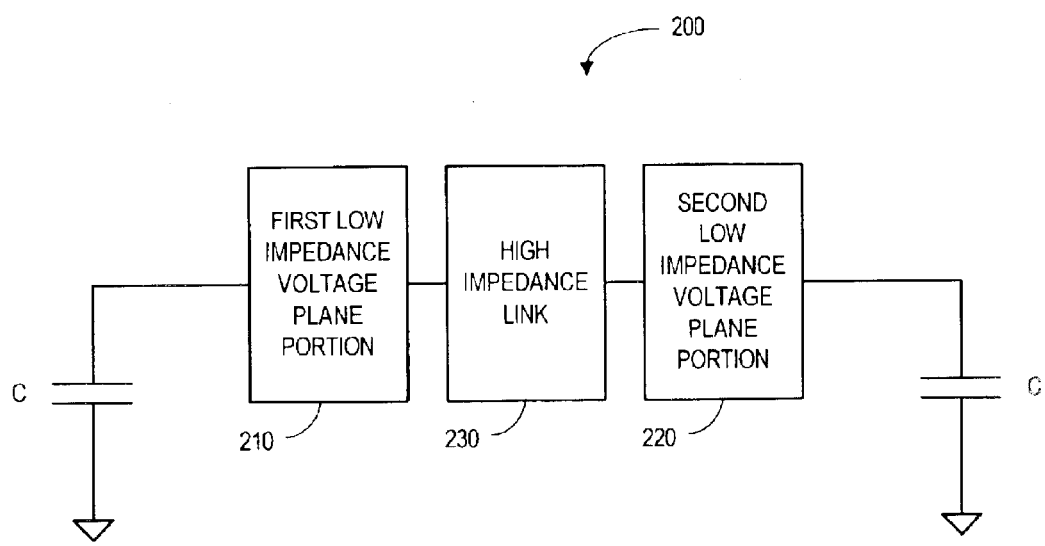
FIG. 2 is a block diagram of a voltage plane in accordance with some embodiments.

FIG. 2 is a block diagram of a voltage plane 200 in accordance with some embodiments. In particular, the voltage plane 200 includes a first low impedance voltage plane portion 210 and a second low impedance voltage plane portion 220. These two portions may comprise, for example, surfaces of conductive material (e.g., material that will have a substantially uniform voltage level). According to the present invention, a high impedance link 230 is coupled between the two portions 210, 220.

The high impedance link 230 may be adapted to couple the voltage level at the first low impedance voltage plane portion 210 to the voltage level at the second low impedance voltage plane portion 220—while isolating noise at the first low impedance voltage plane portion 210 from noise at the second low impedance voltage plane portion 220.

For example, the first low impedance voltage plane portion 210 may be associated with a first signal group, such as signals associated with a Phase-Locked Loop (PLL). On the other hand, the second low impedance voltage plane portion 220 may associated with a second signal group, such as signals associated with an Input Output (IO) buffer. In this way, the high impedance link 230 may reduce noise interference (e.g., high frequency noise interference) between the PLL and the 10 buffer. Note that the voltage plane 200 may be associated with analog signals, digital signals, Radio Frequency (RF) signals, and/or a combination of signal types. For example, the signals may comprise high frequency digital signals associated with high speed interface.

According to some embodiments, the high impedance link 230 is a Stepped impedance Filter (SIF). The SIF may be formed, for example, using a narrow meandered transmission line or a spiral inductor (with or without a reference plane). The SIF may act as a Low Pass Filter (LPF) in a transmission line by providing alternating high and low characteristic impedance lines.

Note that noise at a particular frequency might be reduced by changing the cutoff frequency and/or the attenuation of the SIF. Moreover, implementation of the high impedance link 230 may be straightforward and cost effective (e.g., because the implementation may be compatible with conventional PCB processes).

According to some embodiments, the first and second portions 210, 220 are coupled to a capacitance (C). Moreover, the capacitance may include a first capacitor having a lower value and a second capacitor having a higher value. For example, a lower value capacitor, such as a nano-Farad (nF) order capacitor, might provide high frequency noise filtering. On the other hand, a higher value capacitor, such as a micro-Farad ($\mu$F) order capacitor, might provide low frequency noise filtering. Note that using multiple lower value capacitors may reduce parasitic inductance (e.g., increasing resonance frequency). Also note that, according to some embodiments, no capacitance is coupled to either the first or second portions 210, 220.

Figure 3:
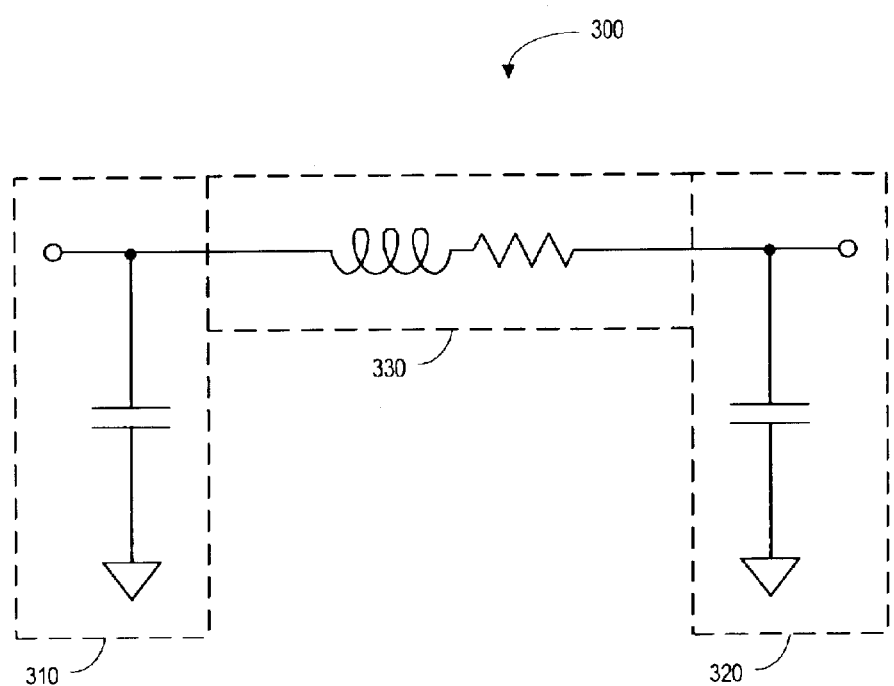
FIG. 3 is an equivalent circuit model of a voltage plane in accordance with some embodiments.

FIG. 3 is an equivalent circuit model 300 of a voltage plane in accordance with this embodiment. In particular, the model 300 includes an inductor and a resistor in series 330. Each end of the series 330 is coupled to a capacitor 310, 320.

Multiple High Impedance Links

Figure 4:
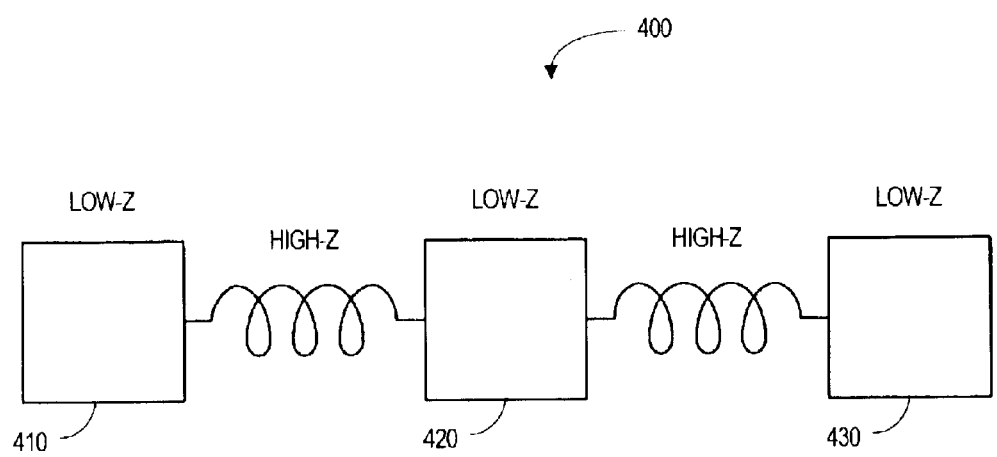
FIG. 4 is a block diagram of a voltage plane with three low impedance portions in accordance with some embodiments.

FIG. 4 is a block diagram of a voltage plane 400 with three low impedance portions in accordance with some embodiments. In this case, a first low impedance voltage plane portion 410 is coupled to a second low impedance voltage plane portion 420 via a high impedance link. In addition, a third low impedance voltage plane portion 430 is coupled to the second low impedance voltage plane portion 420 via another high impedance link. As a result, all three low impedance portions 410, 420, 430 may remain at substantially the same voltage level and yet noise interference between the portions may be reduced. Note that any number of low impedance portions and high impedance links may be utilized in accordance with this embodiment (e.g., five low impedance portions might be coupled via four high impedance links).

Figure 5:
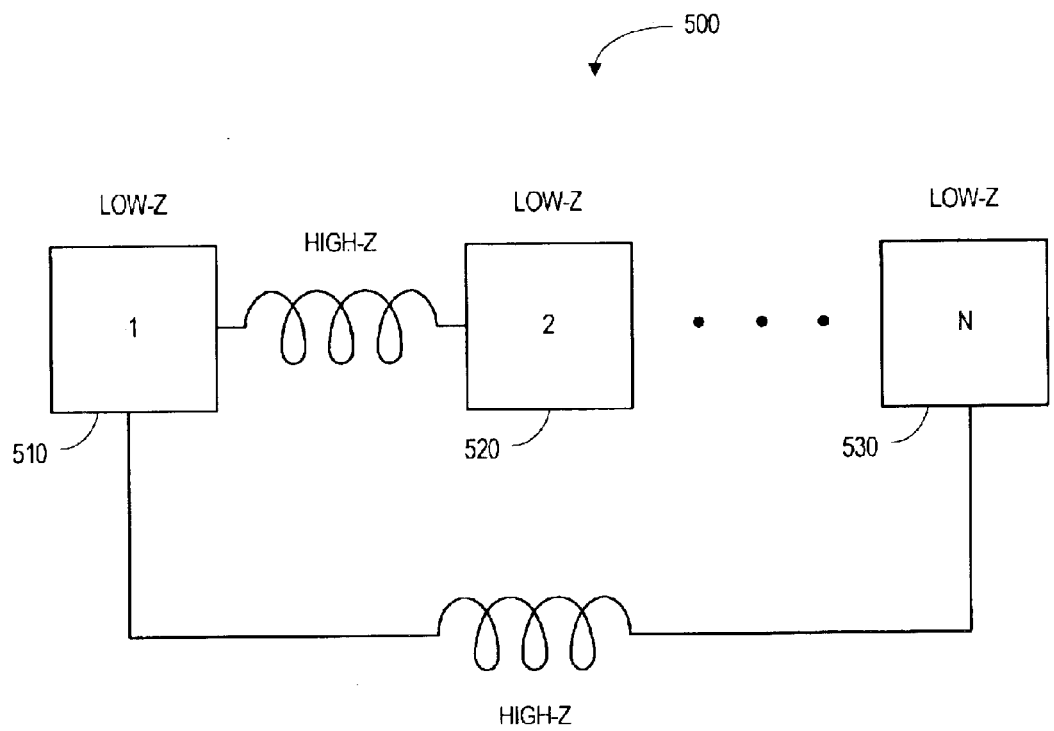
FIG. 5 is a block diagram of a voltage plane with three low impedance portions linked in a loop in accordance with some embodiments.

Similarly, FIG. 5 is a block diagram of a voltage plane 500 with N low impedance portions linked in a loop in accordance with some embodiments. As before, a first low impedance voltage plane portion 510 is coupled to a second low impedance voltage plane portion 520 via a high impedance link. In addition, additional low impedance voltage plane portions are coupled via additional high impedance links. In this case, however, the last low impedance voltage plane portion 530 is also coupled to the first low impedance voltage plane portion 510 via a high impedance link.

EXAMPLES

Figure 6:
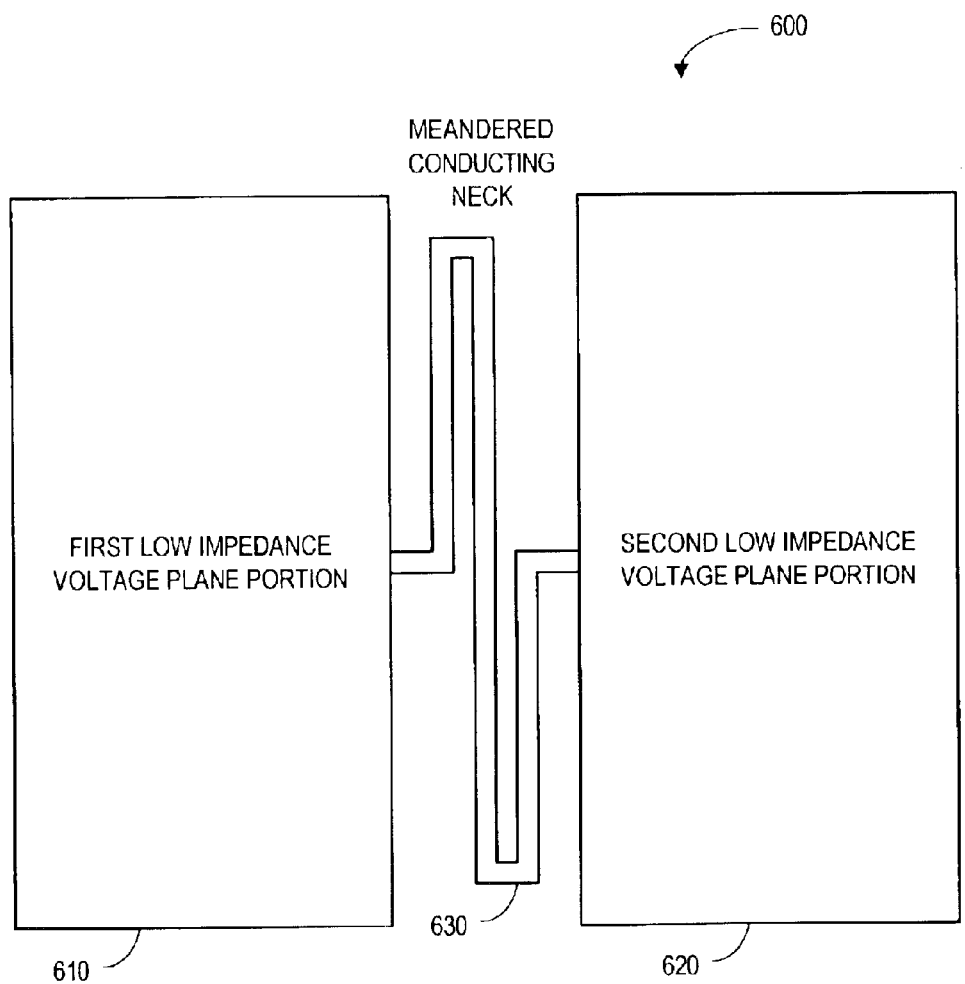
FIG. 6 is a block diagram of a voltage plane with a meandered conducting neck in accordance with some embodiments.

FIG. 6 is a block diagram of a voltage plane 600 with a meandered conducting neck 630 in accordance with some embodiments. In particular, a first low impedance voltage plane portion 610 is coupled to a second low impedance voltage plane portion 620 via the meandered conducting neck 630 (i.e., the high impedance link). By way of example, the meandered conducting neck 630 may act as a SIF and have a 100 micrometer ($\mu$m) trace width, 200 $\mu$m spacing, and a total length of 4.08 centimeters (cm). Note that the particular geometry of the meandered conducting neck 630 may be adjusted as desired in view of the particular application (e.g., the path of the meandered conducting neck 630 may be symmetric or asymmetric).

According to some embodiments, the meandered conducting neck 630 is formed adjacent to a solid metal ground or power plane (e.g., located in another layer or located in the same layer as the meandered conducting neck 630). According to other embodiments, the meandered conducting neck 630 is formed without an adjacent solid metal ground or power plane (e.g., the meandered conducting neck 630 is located in an "open" area). According to still another embodiment, an adjacent solid metal ground or power plane in another layer has the same shape (e.g., follows the same path) as the meandered conducting neck 630.

Figure 7:
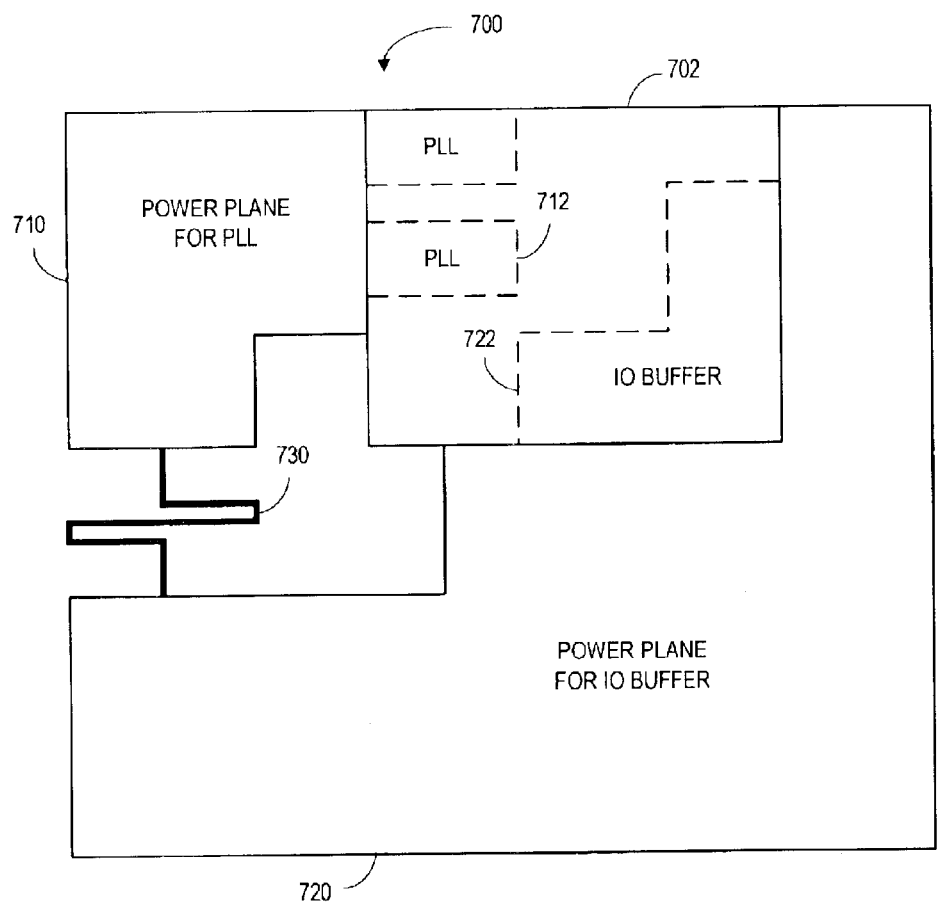
FIG. 7 is a block diagram of a circuit including a power plane in accordance with some embodiments.

FIG. 7 is a block diagram of a circuit 700 having a power plane that is used by components 702 in accordance with some embodiments. In particular, the power plane includes a first low impedance power plane portion 710 associated with a pair of PLLs 712. The power plane also includes a second low impedance power plane portion 720 associated with an IO buffer 722. Moreover, a meandered conducting neck 730 (i.e., a high impedance link) is coupled between the two power plane portions 710, 720.

In this case, the first low impedance power plane portion 710 is associated with a first signal group (i.e., PLL signals) and the second low impedance power plane portion 720 is associated with a second signal group (i.e., IO buffer signals). The two portions may, for example, have a voltage level of 2.5 V. Moreover, the meandered conducting neck 730 increases isolation—and decrease noise interference—between the PLL signals and the IO buffer signals.

Figure 8:
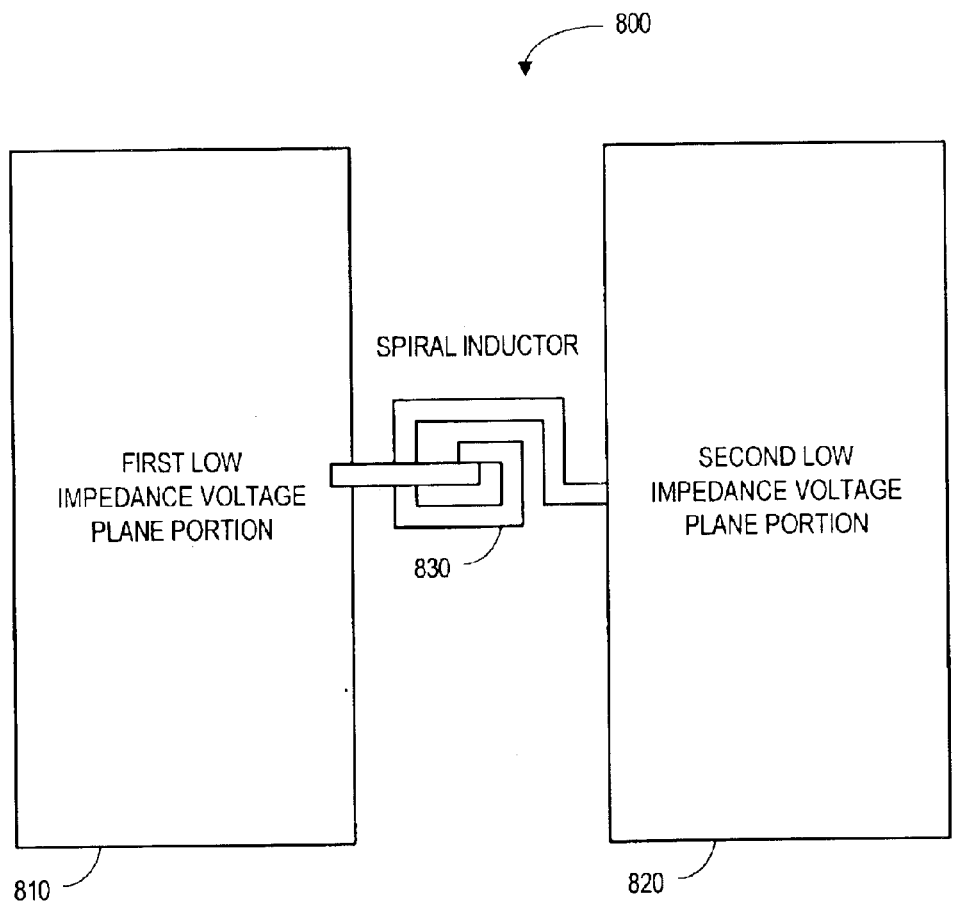
FIG. 8 is a block diagram of a voltage plane with a spiral inductor in accordance with some embodiments.

FIG. 8 is a block diagram of a voltage plane 800 with a spiral inductor 830 in accordance with some embodiments. In particular, a first low impedance voltage plane portion 810 is coupled to a second low impedance voltage plane portion 820 via the spiral inductor 830 (i.e., the high impedance link). Note that the particular geometry of the spiral inductor 830 may be adjusted as desired in view of the particular application (e.g., including any of the ways described with respect to FIG. 6).

Figure 9:
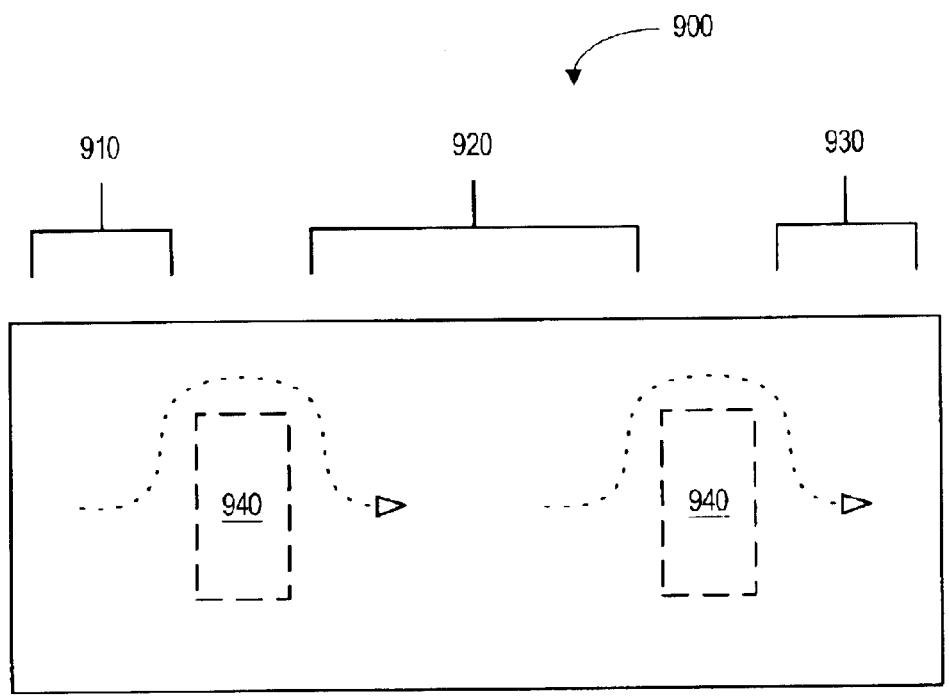
FIG. 9 is a block diagram of a voltage plane with slotted ground filters in accordance with some embodiments.

FIG. 9 is a block diagram of a voltage plane 900 with slotted ground filters 940 in accordance with some embodiments. In particular, a first low impedance voltage plane portion 910 is coupled to a second low impedance voltage plane portion 920 via a slotted ground filter 940. Similarly, a third low impedance voltage plane portion 310 is coupled to the second low impedance voltage plane portion 920 via another slotted ground filter 940. The slotted ground filters 940 may, for example, be associated with another circuit layer. Moreover, the slotted ground filters 940 may introduce less fused current as compared to a meandered conducting neck 630 (e.g., as described with respect to FIG. 6). Other benefits of a slotted ground filter 940 approach may include a Direct Current (DC)/low frequency return path and a small induced current from ground.

Figure 10:
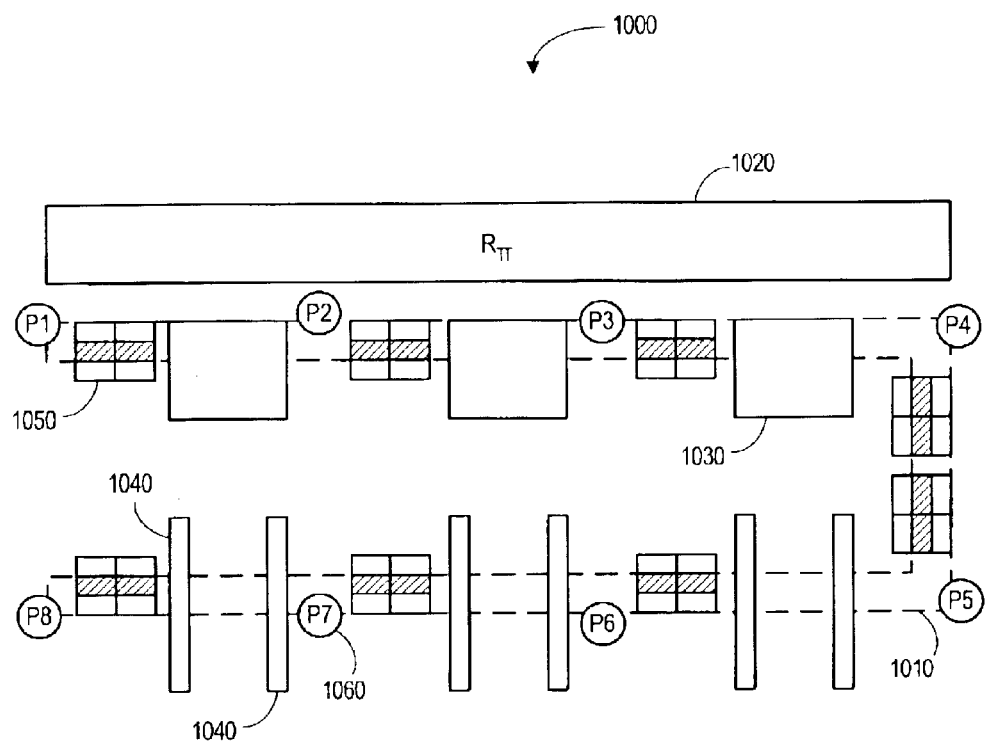
FIG. 10 is a circuit layout including a U-shaped power bus with slotted ground filters in accordance with some embodiments.

FIG. 10 is a circuit layout 1000 including a U-shaped power bus 1010 ($V_{TT}$) with slotted ground filters 1030, 1040 in accordance with some embodiments. Moreover, a termination resistor 1020 ($R_{TT}$) is provided for the $V_{TT}$ power bus 1010.

According to this embodiment, the slotted ground filters 1030, 1040 act as high impedance structures along the $V_{TT}$ power bus 1010 (note that the slotted ground filters 1030, 1040 may be associated with the another layer). Moreover, the inductance of the $V_{TT}$ power bus 1010 is determined by the size and shape of these ground slot filters 1030, 1040 (e.g., including the slot width and length). Considering the layout of the circuit, different ground slot filter shapes may be provided. For example, wide ground slot filters 1030 are provided for some portions while narrow ground slot filters 1040 are provided for other portions (note that pairs of narrow ground slot filters 1040 may actually be provided).

In addition, decoupling capacitors 1050 (e.g., a pair of 0.1 $\mu$F capacitors) are placed between the ground slots 1030, 1040. The capacitors 1050 may comprise, for example, Surface Mounted Technology (SMT) capacitors.

As a result, high frequency noise interference between ports 1060 (i.e., ports P1 through P8) in the circuit layout 1000 may be reduced.

Method

Figure 11:
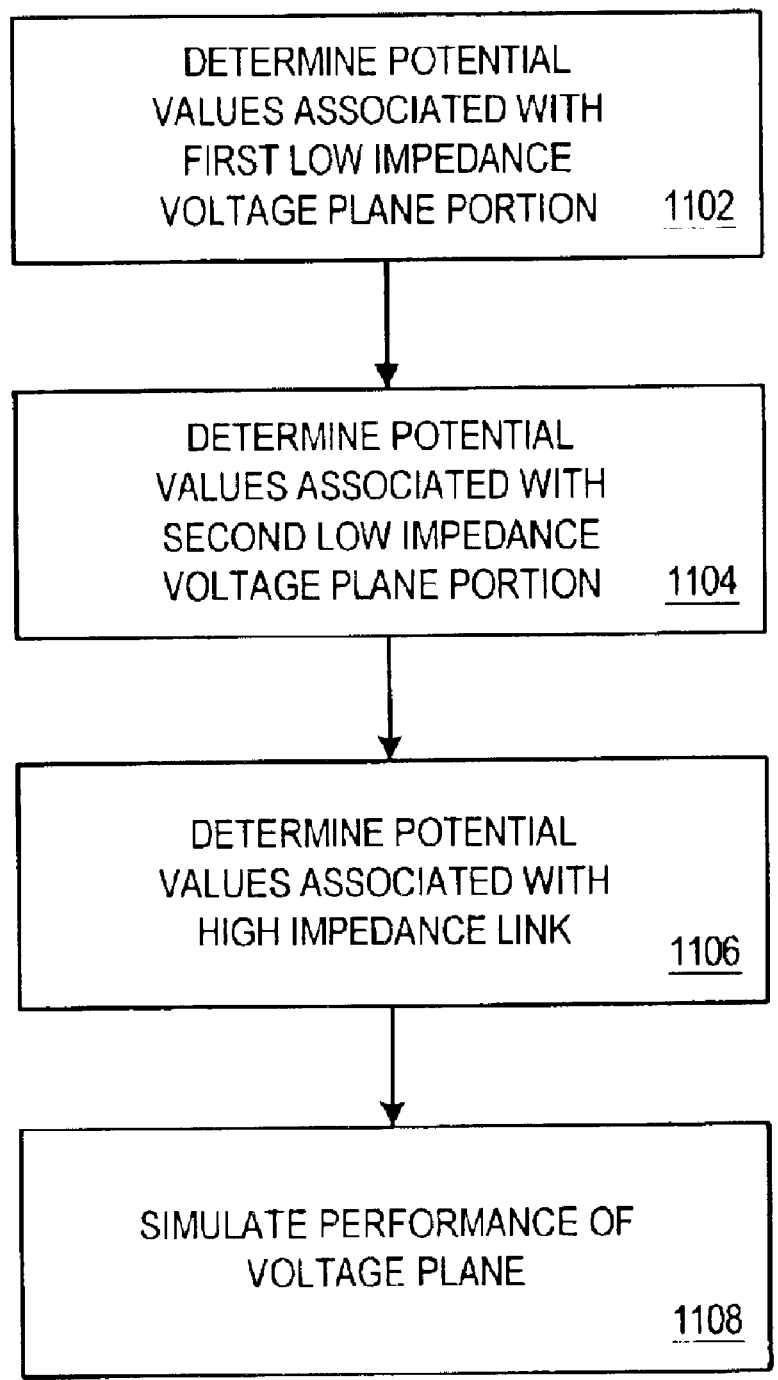
FIG. 11 is a flow chart of a method according to some embodiments.

FIG. 11 is a flow chart of a method according to some embodiments. Note that the flow chart described herein does not necessarily imply a fixed order to the actions, and embodiments may be performed in any order that is practicable. Moreover, the method may be performed, for example, by a designer or by a processor executing instructions stored on a medium.

At 1102, potential values (e.g., prototype values) associated with a first low impedance voltage plane portion are determined. Similarly, potential values associated with a second low impedance voltage plane portion are determined at 1104. The potential values may be associated with, for example, a portion area, a portion shape, and/or a portion material.

At 1106, potential values associated with a high impedance link between the first low impedance voltage plane portion and the second low impedance voltage plane portion are determined. The potential values may be associated with, for example, a link area, a link shape, and/or a link material.

At 1108, the performance of a voltage plane comprising the first low impedance voltage plane portion, the second low impedance voltage plane portion, and the high impedance link is simulated (e.g., by a LPF simulator). The simulation may be associated with, for example, signal characteristics, attenuation, filters, impedance ranges, and phase delays. Based on the performance of the voltage plane, some or all of the potential values may be adjusted (e.g., by a designer or an automated process). For example, potential values might be adjusted to select a cutoff frequency and/or an attenuation associated with a transmission line filter (e.g., by adjusting the size, shape, and position of a slotted ground filter).

Thus, some embodiments of the present invention may provide high isolation between ground and/or power planes (particularly for high frequency noise) along with ESD protection. Moreover, design flexibility may be achieved by changing a cutoff frequency and/or attenuation of a SIF, and embodiments may be less complex and more cost effective as compared to traditional approaches (e.g., when the embodiment is compatible with existing PCB processes).

System

Figure 12:
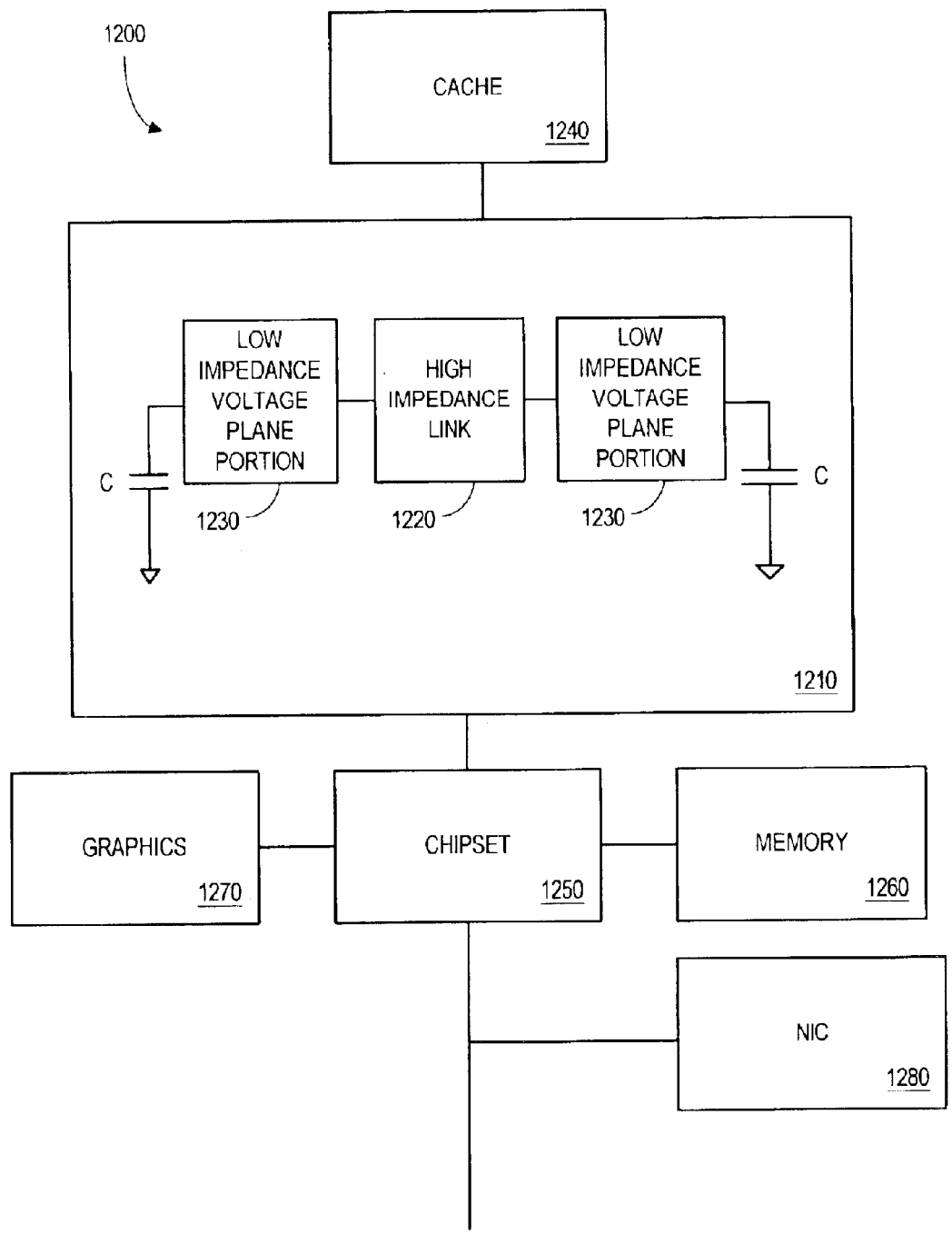
FIG. 12 is a system including an integrated circuit according to some embodiments.

FIG. 12 is a system 1200 including an integrated circuit 1210 with a high impedance link 1220 between two low impedance voltage plane portions 1230 according to some embodiments. The integrated circuit 1210 may be a microprocessor or another type of integrated circuit. According to some embodiments, the integrated circuit 1210 also communicates with an off-die cache 1240. The integrated circuit 1210 may also communicate with a system memory 1260 via a host bus and a chipset 1250. In addition, other off-die functional units, such as a graphics accelerator 1270 and a Network Interface Controller (NIC) 1280 may communicate with the integrated circuit 1210 via appropriate busses.

The high impedance link 1220 and low impedance voltage plane portions 1230 may be associated with any of the embodiments disclosed herein, including those of FIGS. 2 through 11.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although particular geometries for a high impedance link have been described, other embodiments may be practiced with other geometries (e.g., a meandered conducting neck might have a different trace width, spacing, and/or total length). Similarly, low impedance voltage plane portions may have geometries other than those described herein.

The several embodiments described herein are solely for the purpose of illustration. Persons skilled in the art will recognize from this description other embodiments may be practiced with modifications and alterations limited only by the claims.

What is claimed is:

1. A voltage plane, comprising:
   a first low impedance voltage plane portion;
   a second low impedance voltage plane portion; and
   a high impedance link between the first low impedance voltage plane portion and the second low impedance voltage plane portion, wherein the high impedance link comprises a meandered conducting neck.

2. The voltage plane of claim 1, wherein the voltage plane comprises one of: (i) a ground plane, (ii) a power plane, or (iii) a power bus.

3. The voltage plane of claim 1, wherein the voltage plane is associated with at least one of: (i) an integrated circuit, (ii) application specific integrated circuit, (iii) a processor, (iv) a memory device, (v) a package, (vi) a chipset, (vii) a printed circuit board, or (viii) a motherboard.

4. The voltage plane of claim 1, wherein the first low impedance voltage plane portion is associated with a first signal group and the second low impedance voltage plane portion is associated with a second signal group.

5. The voltage plane of claim 1, wherein the voltage plane is associated with at lease one of: (i) analog signals, (ii) digital signals, (iii) radio frequency signals, (iv) a combination of signal types, (v) high frequency signals, or (vi) high speed interface signals.

6. The voltage plane of claim 1, wherein the high impedance link is adapted to couple the voltage level at the first low impedance voltage plane portion to the voltage level at the second low impedance voltage plane portion while isolating noise at the first low impedance voltage plane portion from noise at the second low impedance voltage plane portion.

7. The voltage plane of claim 1, further comprising:
   a first capacitance coupled to the first low impedance voltage plane portion; and
   a second capacitance coupled to the second low impedance voltage plane portion.

8. The voltage plane of claim 7, wherein at least one of the first capacitance and the second capacitance includes (i) a first capacitor having a lower value, and (ii) a second capacitor having a higher value.

9. The voltage plane of claim 1, further comprising:
   a third low impedance voltage plane portion; and
   another high impedance link between the second low impedance voltage plane portion and the third low impedance voltage plane portion.

10. The voltage plane of claim 9, further comprising:
    another high impedance link between the first low impedance voltage plane portion and the third low impedance voltage plane portion.

11. A voltage plane, comprising:
    a first low impedance voltage plane portion;
    a second low impedance voltage plane portion;
    a high impedance link between the first low impedance voltage plane portion and the second low impedance voltage plane portion;
    a third low impedance voltage plane portion; and
    another high impedance link between the second low impedance voltage plane portion and the third low impedance voltage plane portion.

12. The voltage plane of claim 11, wherein the voltage plane comprises one of: (i) a ground plane, (ii) a power plane, or (iii) a power bus.

13. The voltage plane of claim 11, wherein the voltage plane is associated with at least one of: (i) an integrated circuit, (ii) application specific integrated circuit, (iii) a processor, (iv) a memory device, (v) a package, (vi) a chipset, (vii) a printed circuit board, or (viii) a motherboard.

14. The voltage plane of claim 11, wherein the first low impedance voltage plane portion is associated with a first signal group and the second low impedance voltage plane portion is associated with a second signal group.

15. The voltage plane of claim 11, wherein the voltage plane is associated with at lease one of: (i) analog signals, (ii) digital signals, (iii) radio frequency signals, (iv) a combination of signal types, (v) high frequency signals, or (vi) high speed interface signals.

16. The voltage plane of claim 11, wherein the high impedance link is adapted to couple the voltage level at the first low impedance voltage plane portion to the voltage level at the second low impedance voltage plane portion while isolating noise at the first low impedance voltage plane portion from noise at the second low impedance voltage plane portion.

17. The voltage plane of claim 11, further comprising:
a first capacitance coupled to the first low impedance voltage plane portion; and
a second capacitance coupled to the second low impedance voltage plane portion.

18. The voltage plane of claim 17, wherein at least one of the first capacitance and the second capacitance includes (i) a first capacitor having a lower value, and (ii) a second capacitor having a higher value.

19. The voltage plane of claim 11, further comprising:
another high impedance link between the first low impedance voltage plane portion and the third low impedance voltage plane portion.

20. A system, comprising:
a chipset; and
a die comprising a microprocessor in communication with the chipset, wherein the microprocessor includes a voltage plane comprising:
a first low impedance voltage plane portion;
a second low impedance voltage plane portion; and
a high impedance link between the first low impedance voltage plane portion and the second low impedance voltage plane portion.

21. The system of claim 20, wherein the voltage plane comprises one of: (i) a ground plane, (ii) a power plane, or (iii) a power bus.

22. A voltage plane, comprising:
a first low impedance voltage plane portion;
a second low impedance voltage plane portion; and
a high impedance link between the first low impedance voltage plane portion and the second low impedance voltage plane portion, wherein the high impedance link comprises a stepped impedance filter.

23. The voltage plane of claim 22, further comprising:
a first capacitance coupled to the first low impedance voltage plane portion; and
a second capacitance coupled to the second low impedance voltage plane portion.

24. The voltage plane of claim 23, wherein at least one of the first capacitance and the second capacitance includes (i) a first capacitor having a lower value, and (ii) a second capacitor having a higher value.

25. The voltage plane of claim 22, the voltage plane is associated with at least one of: (i) an integrated circuit, (ii) application specific integrated circuit, (iii) a processor, (iv) a memory device, (v) a package, (vi) a chipset, (vii) a printed circuit board, or (viii) a motherboard.

26. The voltage plane of claim 22, wherein the first low impedance voltage plane portion is associated with a first signal group and the second low impedance voltage plane portion is associated with a second signal group.

27. The voltage plane of claim 22, wherein the voltage plane is associated with at lease one of: (i) analog signals, (ii) digital signals, (iii) radio frequency signals, (iv) a combination of signal types, (v) high frequency signals, or (vi) high speed interface signals.

28. The voltage plane of claim 22, wherein the high impedance link is adapted to couple the voltage level at the first low impedance voltage plane portion to the voltage level at the second low impedance voltage plane portion while isolating noise at the first low impedance voltage plane portion from noise at the second low impedance voltage plane portion.

29. The voltage plane of claim 22, wherein the voltage plane comprises one of: (i) a ground plane, (ii) a power plane, or (iii) a power bus.

30. A voltage plane, comprising:
a first low impedance voltage plane portion;
a second low impedance voltage plane portion; and
a high impedance link between the first low impedance voltage plane portion and the second low impedance voltage plane portion, wherein the high impedance link comprises a slotted ground filter.

31. The voltage plane of claim 30, further comprising:
a first capacitance coupled to the first low impedance voltage plane portion; and
a second capacitance coupled to the second low impedance voltage plane portion.

32. The voltage plane of claim 31, wherein at least one of the first capacitance and the second capacitance includes (i) a first capacitor having a lower value, and (ii) a second capacitor having a higher value.

33. The voltage plane of claim 30, wherein the voltage plane is associated with at least one of: (i) an integrated circuit, (ii) application specific integrated circuit, (iii) a processor, (iv) a memory device, (v) a package, (vi) a chipset, (vii) a printed circuit board, or (viii) a moth board.

34. The voltage plane of claim 30, wherein the first low impedance voltage plane portion is associated with a first signal group and the second low impedance voltage plane portion is associated with a second signal group.

35. The voltage plane of claim 30, wherein the voltage plane is associated with at lease one of: (i) analog signals, (ii) digital signals, (iii) radio frequency signals, (iv) a combination of signal types, (v) high frequency signals, or (vi) high speed interface signals.

36. The voltage plane of claim 30, wherein the high impedance link is adapted to couple the voltage level at the first low impedance voltage plane portion to the voltage level at the second low impedance voltage plane portion while isolating noise at the first low impedance voltage plane portion from noise at the second low impedance voltage plane portion.

37. The voltage plane of claim 30, wherein the voltage plane comprises one of: (i) a ground plane, (ii) a power plane, or (iii) a power bus.

* * * * *